United States Patent

Igarashi et al.

[11] Patent Number: 5,336,574
[45] Date of Patent: Aug. 9, 1994

[54] CURABLE COMPOSITION AND PROCESS FOR PRODUCING SHADOW MASK USING THE SAME

[75] Inventors: Ichiro Igarashi, Tokai; Hiroshi Sasaki, Nagoya, both of Japan; Tetsuji Jitsumatsu, Scarsdale, N.Y.; Hiroyuki Ota, Anjo, Japan; Masanobu Sato, Kurita, Japan; Hirofumi Nishimuta, Hikone, Japan

[73] Assignee: Toagosei Chemical Industry Co., Ltd., Tokyo, Japan

[21] Appl. No.: 955,206

[22] Filed: Oct. 2, 1992

[30] Foreign Application Priority Data

Oct. 4, 1991 [JP] Japan .................. 3-284020
Oct. 4, 1991 [JP] Japan .................. 3-284021

[51] Int. Cl.$^5$ .................................. G03C 5/00
[52] U.S. Cl. ............................ 430/23; 430/287; 430/288
[58] Field of Search ............... 430/23, 288, 287; 525/502; 522/166

[56] References Cited

U.S. PATENT DOCUMENTS

| 3,679,500 | 7/1972 | Kubo et al. | 156/11 |
| 4,439,291 | 3/1984 | Irving et al. | 204/159.23 |
| 4,632,726 | 12/1986 | Thomas | 156/644 |

FOREIGN PATENT DOCUMENTS

| 63-17908 | 1/1988 | Japan . |
| 261410 | 10/1989 | Japan . |
| 110166 | 4/1990 | Japan . |
| 133404 | 5/1990 | Japan . |
| 272537 | 12/1991 | Japan . |

*Primary Examiner*—Steve Rosasco
*Attorney, Agent, or Firm*—Browdy & Neimark

[57] ABSTRACT

A curable composition comprising the following components (a), (b), (c) and (d) and/or (e):
- (a) a compound having one carboxyl group and one (meth)acryloyl group in the molecule,
- (b) a compound having two or more (meth)acryloyl groups in the molecule,
- (c) a levelling agent, and
- (d) a chain transfer agent and/or
- (e) a tertiary amine type photoinitiator; and a process for producing a shadow mask, comprising two etching steps, wherein the above curable composition is used as a secondary etching resist material.

2 Claims, 1 Drawing Sheet

CURABLE COMPOSITION AND PROCESS FOR PRODUCING SHADOW MASK USING THE SAME

The present invention relates to a curable composition which is cured by heating or by an active energy ray, as well as to a process for producing a shadow mask by using said composition.

The curable composition according to the present invention is used not only in production of a shadow mask but also as an ordinary coating or casting material.

Shadow masks used in color picture tubes are produced by making, in a flat iron plate of about 0.1–0.25 mm in thickness, many small holes of 0.1–0.15 mm in diameter for enabling passage of electron beams. The small holes have various shapes and are typically circular or rectangular.

Making small holes in a shadow mask is conducted by applying an etching resist film to surface portions of the above flat iron plate other than small portions in which small holes are to be made, and then contacting the iron plate having the resist film, with an etching solution. In order to obtain a shadow mask capable of giving a clear television image, it is necessary to make desired small holes with a high precision. As a means for enabling it, there is known a process which comprises conducting etching in two times (U.S. Pat. No. 3,679,500). The outline of the process is described below.

First, on each side of an iron plate having the above-mentioned thickness is foraged a photosensitive resin film comprising, for example, casein or polyvinyl alcohol and ammonium bichromate. Then, a negative film having a desired pattern therein is intimately contacted with each film on the iron plate and a radiation (e.g., ultraviolet rays) is applied, whereby portions of the photosensitive resin films exposed to the radiation are cured. Unexposed and uncured portions of the photosensitive resin films are removed with hot water or the like.

Next, the one or both sides of the iron plate (each side now has the pattern formed thereon) is subjected to etching (this etching is hereinafter referred to as primary etching) with an etching solution (e.g., iron perchloride) to form dented portions which are later made into small holes. Thereafter, a new etching resist material is coated only on one side of the iron plate having the dented portions, to fill the dented portions and form a resist film on the whole surface of said side.

The iron plate whose dented portions have been protected with an etching resist material at one side is contacted again with an etching solution. That is, etching (this etching is hereinafter referred to as secondary etching) is applied to the unprotected side of the iron plate to make small perforations. Then, the resist film for pattern formation and the resist film for dented portions protection are removed with an aqueous alkali solution, whereby a shadow mask is obtained.

In the secondary etching in the above process, there has been mainly used, as the material for protecting the dented portions of one side of the iron plate (said material is hereinafter referred to as secondary resist material), a low-viscosity resin solution obtained by dissolving a high-molecular compound (e.g. alkyd resin) in a chlorine-containing organic solvent, because it can easily fill the inside of each dented portion formed in the primary etching, without leaving air bubbles and moreover has excellent etching resistance and excellent solubility in aqueous alkali solution.

Recently, a material using a chlorine-free solvent has been desired as the secondary resist material in view of problems such as environmental pollution and workers' health. In this connection, there have been proposed ultraviolet ray-curing resist materials using a hydrophilic organic solvent (e.g., alcohol, ketone or ester) as a diluent [Japanese Patent Application Kokai (Laid-Open) No. 261410/1989, Japanese Patent Application Kokai (Laid-Open) No. 110166/1990, Japanese Patent Application Kokai (Laid-Open) No. 133404/1990, etc.].

Each of these ultraviolet ray-curing resist materials disclosed in the above documents comprises polymerizable components such as monomer or oligomer having a (meth)acryloyl group, monomer having a carboxyl group and a (meth)acryloyl group and the like and the above-mentioned hydrophilic organic solvent, and forms an etching resist film when exposed to ultraviolet rays or electron beams. Such ultraviolet ray-curing resist materials enabled formation of a resist film having substantially the same properties as possessed by the resist film formed from the conventional resist material comprising a high-molecular compound (e.g., alkyd resin), and simplified the process for shadow mask production.

With the above ultraviolet ray-curing resist materials, however, the resulting shadow mask products included not only perfect products but also defectives having partial strains, depending upon the types of small hole patterns made in shadow mask material. The percent defective was high in the case of a shadow mask having, for example, very small holes of slit shape as shown in FIG. 1.

The present invention is intended to provide an active energy ray-curable composition using no chlorine-containing organic solvent, which can be used as a secondary resist material with no problem in production of shadow masks having various small-hole patterns, including a shadow mask having slit-shaped very small holes.

The present inventors made extensive study in order to solve the above-mentioned problems. As a result, the present inventors found that a curable composition comprising a compound having two or more (meth)acryloyl groups in the molecule as an ultraviolet ray-polymerizable component and a chain transfer agent or a tertiary amine type photoinitiator can give a cured film having very high etching resistance and, even when applied for production of a shadow mask having slit-shaped very small holes, can give a normal shadow mask having no strain. The finding has led to the completion of the present invention.

The first aspect of the present invention is a curable composition comprising the following components (a), (b), (c) and (d):
  (a) a compound having one carboxyl group and one (meth)acryloyl group in the molecule,
  (b) a compound having two or more (meth)acryloyl groups in the molecule,
  (c) a levelling agent, and
  (d) a chain transfer agent.

The second aspect of the present invention is an ultraviolet ray-curable composition comprising the following components (a), (b), (c) and (e):
  (a) a compound having one carboxyl group and one (meth)acryloyl group in the molecule,
  (b) a compound having two or more (meth)acryloyl groups in the molecule,
  (c) a levelling agent, and (e) a tertiary amine type photoinitiator.

The third aspect of the present invention is a process for producing a shadow mask, comprising the following steps (1) to (4), wherein the curable composition of the first aspect or the second aspect is used as a secondary etching resist material in the step (2):

(1) a primary etching step of applying etching to at least one side of a metal sheet for a shadow mask, which sheet consists of a thin metal plate and etching resist films formed on both sides of the plate in a desired pattern, to form dented portions at the exposed places provided in the side of the metal sheet, (2) a step of coating a secondary etching resist material on the side or one of the two sides of the metal sheet having the dented portions formed in the primary etching step (1), (3) a secondary etching step of applying etching to the side of the metal sheet on which no secondary etching resist material was coated in the step (2), to forte small perforations communicating with the dented portions of the other metal sheet side formed in the step (1), and (4) a step of removing all of the etching resist films and material by using an aqueous alkali solution.

Figure 1:
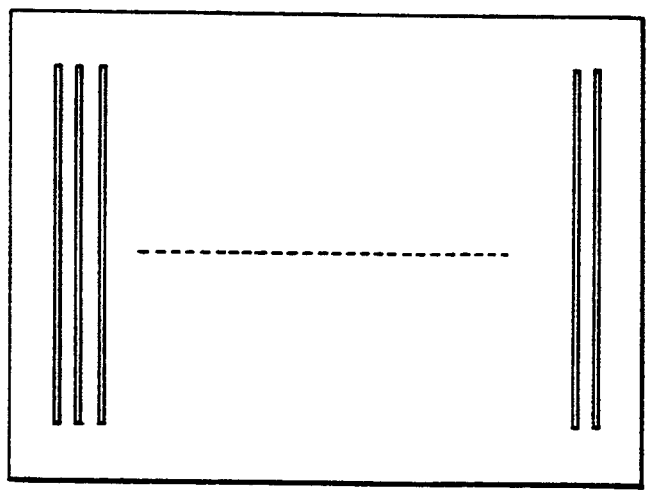
FIG. 1 is a schematic view showing a shadow mask having slit-shaped very small holes, produced from an iron plate in the working exmaples described hereinafter.

Detailed description is hereinafter made on the components constituting the curable compositions of the first aspect and the second aspect.

The component (a) is a component for endowing the cured film obtained from the composition of the present invention, with solubility in aqueous alkali solution or removability from substrate with aqueous alkali solution.

As specific examples of the component (a), there are preferred compounds belonging to the following (A1) and (A2).

(A1) Reaction products between a dibasic acid or an anhydride thereof and a (meth)acrylate having a hydroxyl group at the end of the molecule.

The dibasic acid or the anhydride thereof includes phthalic acid, tetrahydrophthalic acid, hexahydrophthalic acid, maleic anhydride, succinic acid, etc. The (meth)acrylate having a hydroxyl group at the end of the molecule includes hydroxyethyl (meth)acrylate, hydroxypropyl (meth)acrylate, etc.

Specific examples of the (A1) compounds are acryloyloxyethyl monophthalate [e.g. ARONIX M-5400 (trade name) manufactured by TOAGOSEI CHEMICAL INDUSTRY CO., LTD.], (meth)acryloyloxypropyl monophthalate, (meth)acryloyloxyethyl monotetrahydrophthalate, (meth)acryloyloxypropyl monotetrahydrophthalate, (meth)acryloyloxyethyl monohexahydrophthalate, (meth)acryloyloxypropyl monohexahydrophthalate, acryloyloxyethyl monosuccinate [e.g., ARONIX M-5500 (trade name) manufactured by TOAGOSEI CHEMICAL INDUSTRY CO., LTD.], (meth)acryloyloxypropyl monosuccinate and maleic anhydride monohydroxyethyl (meth)acrylate, (A2) Reaction products between a lactone and (meth)acrylic acid A typical lactone is $\epsilon$-caprolactone.

Specific examples of the (A2) compounds include ARONIX M-5300 (trade name) manufactured by TOAGOSEI CHEMICAL INDUSTRY CO., LTD.

(Meth)acryloyloxyethyl monophthalate and (meth)acryloyloxyethyl monosuccinate are preferred in view of the removability of cured film with aqueous alkali solution.

Acrylic acid, methacrylic acid, etc. are also usable but have odors and skin irritations.

The amount of the component (a) used is preferably 20–70 parts by weight (parts by weight are hereinafter referred to simply as parts), more preferably 30–60 parts per 100 parts of the total of the component (a) and the component (b). When the amount is less than 20 parts, the cured film of the resulting composition is not sufficient in solubility in aqueous alkali solution or removability with aqueous alkali solution. When the amount is more than 70 parts, the cured film has poor etching resistance.

The component (b) is a component for endowing the curable composition of the present invention with high curability and the cured film obtained from said composition with high etching resistance. Specific examples of the component (b) are compounds belonging to the following (B1), (B2) and (B3).

(B1) Polyol (meth)acrylates

There are cited polyethylene glycol di(meth)acrylate, polypropylene glycol di(meth)acrylate, compounds obtained by reacting (meth)acrylic acid with a diol obtained by adding ethylene oxide to hydroxyl groups of bisphenol A [e.g., ARONIX M-210 (trade name) manufactured by TOAGOSEI CHEMICAL INDUSTRY CO., LTD.], trimethylolpropane tri(meth)acrylate, pentaerythritol tri(meth)acrylate, and the like.

(B2) Polyester (meth)acrylates

They are reaction products between a polyester polyhydric alcohol and (meth)acrylic acid.

(B3) Epoxy (meth)acrylates

They are compounds obtained by reacting (meth)acrylic acid with epoxy groups of an epoxy compound having two or more epoxy groups in the molecule. The epoxy compound is typically diglycidyl ether of bisphenol A.

The components (b) are preferably polyol (meth)acrylates, particularly preferably a compound obtained by reacting (meth)acrylic acid with a diol obtained by adding ethylene oxide to hydroxyl groups of bisphenol A.

The amount of the component (b) used is preferably 30–80 parts, more preferably 40–70 parts per 100 parts of the total amount of the component (a) and the component (b). When the amount is less than 30 parts, the cured film of the resulting composition has poor etching resistance. When the amount is more than 80 parts, the cured film has insufficient removability with alkali.

The component (c) is used for endowing the cured film of the resulting composition with high surface smoothness. As the component (c), there is preferred a fluorine-containing compound having surface activity or a silicone compound. Specific examples of the component (c) include Fluorad FC-430 (a product of SUMITOMO 3M LIMITED), Megafac F-177 (a product of DAINIPPON INK & CHEMICALS, INC.) and Megafac F-179 (a product of DAINIPPON INK & CHEMICALS, INC.) which are fluorinated alkyl esters of nonionic type and, as a silicone type compound, NUC SILICONE L7002 (a product of NIPPON UNICAR CO., LTD.).

The amount of the component (c) used is preferably about 0.01–5 parts per 100 parts of the total amount of the component (a) and the component (b).

The compounds usable as the component (d) include mercaptans such as octylmercaptan, nonylmercaptan, decylmercaptan, dodecylmercaptan, cetylmercaptan and the like; hydroxyl group-substituted mercaptans such as monothioethylene glycol, α-monothioglycerine and the like; and mercaptocarboxylic acids such as mercaptopropionic acid, 2-mercaptopropionic acid, thiolactic acid, thiomalic acid and the like.

The amount of the compound (d) used is preferably 0.01–5 parts, more preferably 0.3–3 parts per 100 parts of the total amount of the component (a) and the component (b).

When the amount is less than 0.01 part, the shadow mask obtained by removing the cured film of the resulting composition therefrom with an aqueous alkali solution tends to have problems that distances between the small holes made in the shadow mask are nonuniform and that the metal plate has strain. When the amount is more than 5 parts, the resulting composition has low stability and may give rise to viscosity change.

The curable composition according to the first aspect can be polymerized to form a crosslinked cured product because it comprises the component (b); however, the molecular weight of the polymer is relatively low because the composition comprises the component (d), i.e. a chain transfer agent. Hence, it is presumed that the volume contraction during polymerization is small and the thin metal plate for shadow mask undergoes no deformation.

The composition of the second aspect uses, as an essential component, the component (e) which is a particular photoinitiator, in place of the component (d) in the composition of the first aspect. Owing to the use of the component (e), the curing reaction of the curable composition caused by ultraviolet rays takes place uniformly in all portions of the coating film, suppressing the strain caused by curing and contraction. The component (d) and the component (e) may be used in combination in the curable composition of the present invention.

Specific examples of the component (e) are 2-methyl-1-[4-(methylthio)phenyl]-2-morpholinopropane-1-one [the commercial products include Irgacure 907 manufactured by Chiba-Geigy (Japan) Limited], 4,4'-bisdiethylaminobenzophenone, 4,4'-bisdimethylaminobenzophenone, 2-benzyl-2-dimethylamino-1-(4-morpholinophenyl)-butan-1-one [the commercial products include Irgacure 369 manufactured by Chiba-Geigy (Japan) Limited], methyl p-dimethylaminobenzoate, ethyl p-dimethylaminobenzoate, isoamyl p-dimethylaminobenzoate, 2-dimethylaminoethyl benzoate and 2-butoxyethyl 4-dimethylaminobenzoate.

The amount of the component (e) used is preferably 1–10 parts per 100 parts of the total amount of the component (a) and the component (b).

The curable compositions of the first aspect and the second aspect comprise, as the essential components, the components (a), (b), (c) and (d) and the components (a), (b), (c) and (e), respectively. The compositions may further comprise the following additives.

The compositions may comprise if necessary, as a reactive diluent, a polymerizable component such as hydroxyethyl (meth)acrylate, hydroxypropyl (meth)acrylate, acrylamide, diacetone acrylamide, dimethylacrylamide, benzyl (meth)acrylate, acryloylmorpholine, tetrahydrofurfuryl (meth)acrylate, 2-ethylhexyl (meth)acrylate, mono(meth)acrylate of polyalkylene (2–3 carbon atoms) glycol monoalkyl (1–9 carbon atoms) ether, polyethylene glycol mono(meth)acrylate, phenoxyethoxyethyl acrylate [ARONIX M-101 (trade name) manufactured by TOAGOSEI CHEMICAL INDUSTRY CO., LTD.] or the like.

The curable composition of the first aspect can be cured by irradiation with an active energy ray such as ultraviolet rays, visible light, electron beams or the like, or by heating. The composition can comprise the following additives depending upon the curing means used, in order to accelerate the curing reaction.

When curing is conducted by irradiation of ultraviolet rays or visible light, it is preferable to use a photoinitiator such as benzophenone or its derivative, benzoin, benzoin alkyl ether, 2-methyl-[4-methyl-4-phenyl]-2-morpholino-1-propane, benzyldimethylketal, 1-hydroxycyclohexylphenylketone (Irgacure 184 manufactured by Chiba-Geigy (Japan) Limited) or the like. The component (e) (a photoinitiator) can also be used preferably.

The amount of the photoinitiator used is preferably 1–10 parts per 100 parts of the total amount of the component (a) and the component (b).

When curing is conducted by heating with a furnace, infrared rays, a microwave or the like, it is preferable to use a polymerization initiator capable of generating a radical by heating, such as azobisisobutyronitrile, ketone peroxide, hydroperoxide, alkyl peroxide, acyl peroxide, peroxyester or the like.

An organic solvent may further be used if necessary. As the preferable organic solvent, there are cited alcohols such as methanol, ethanol, butanol, IPA and the like; cellosolves such as butyl cellosolve, methyl cellosolve, ethyl cellosolve and the like; cellosolve acetates such as methylcellosolve acetate, ethylcellosolve acetate, butylcellosolve acetate and the like; propylene glycol monomethyl ether; toluene and xylene; and so forth.

The viscosity of the compositions of the present invention is preferably 5,000 cp or less, more preferably 2,000 cp or less at 25° C.

Next, description is made on a process for production of a shadow mask by using one of the above curable compositions. Conventional techniques per se can be employed up to the step in which a pattern is formed on a metal plate by using a photosensitive resin so that surface portions of the metal plate other than portions at which small holes are to be made can be covered with a cured film of said resin.

The depth of the dented portions formed in the primary etching is preferably about ½ of the thickness of the thin metal plate used and is specifically about 30–80 mm. Formation of dented portions having such a depth can be achieved by dipping the metal plate, in an aqueous ferric chloride solution (concentration: about 43%) of 40°–60° C. for about 20–30 minutes.

As a method for coating the curable composition of the present invention on one side of the thin metal plate prior to the second etching, there are cited roll coating, spray coating, flow coating, dip coating, etc. In this coating, it is necessary that the inside of each dented portion should be completely filled with the curable composition. Therefore, the curable composition preferably has a low viscosity. The preferable thickness in which the curable composition is coated, is about 30 mm at the portions other than the dented portions.

The curing of the coating film formed above can be conducted by heating or irradiation with an active energy ray. The curing by ultraviolet ray irradiation is convenient in workability and is completed ordinarily in 5 seconds. A high-pressure mercury lamp can be used as a light source for ultraviolet rays.

The secondary etching can be conducted using an etching solution similar to that used in the primary etching, under substantially the same conditions as used in the primary etching.

Lastly, all the resist films are removed to obtain a shadow mask. An aqueous alkali (e.g., NaOH) solution is used to remove the resist film formed in a desired pattern by using a photosensitive resin and the resist film formed with the curable composition of the present invention.

The compositions of the present invention can be cured easily and quickly by irradiation of an active energy ray, for example, ultraviolet rays, to form a cured film having high resistance to an etching solution such as iron perchloride solution or the like. Further, the cured film can be dissolved in an aqueous alkali solution and removed from the substrate.

Furthermore, the present compositions are low in volume contraction during curing and consequently the substrate undergoes little strain; hence, the compositions can suitably be applied to substrates which are deformed even by very weak force. Thus, the present compositions are very suitable particularly as a resist material for the secondary etching in shadow mask production.

The present invention is hereinafter described in more detail by way of Examples and Comparative Examples.

EXAMPLE 1

The following 5 components were dissolved and mixed to obtain an active energy ray-curable composition.

| | |
|---|---|
| Component (a): acryloyloxyethyl monophthalate [ARONIX M-5400 (trade name) manufactured by TOAGOSEI CHEMICAL INDUSTRY, CO., LTD.] | 60 parts |
| Component (b): trimethylolpropane triacrylate [ARONIX M-309 (trade name) manufactured by TOAGOSEI CHEMICAL INDUSTRY, CO., LTD.] | 40 parts |
| Component (c): Megafac F-177 manufactured by DAINIPPON INK & CHEMICALS, INC. | 0.1 part |
| Component (d): dodecylmercaptan | 0.5 part |
| Photoinitiator: 1-hydroxycyclohexylphenylketone [Irgacure 184 (trade name) manufactured by Chiba-Geigy (Japan) Limited] | 5 parts |

Using the above composition as a resist material for secondary etching, a shadow mask was produced as follows.

An iron plate of 0.15 mm in thickness was dipped in a photosensitive resin solution consisting of casein and ammonium bichromate, to coat the photosensitive resin solution on both sides of the iron plate. The coated solution was dried at 90° C. for 10 minutes.

Figure 2:
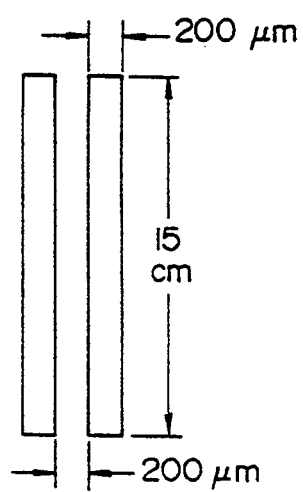
FIG. 2 is a view wherein the lateral dimension of the slit-shaped very small holes of FIG. 1 has been enlarged.

The iron plate having the resin film on both sides thereof was inserted between a pair of negative films each having a pattern as shown in FIGS. 1 and 2, and ultraviolet rays emitted from a xenon lamp were applied to the negative films to cure the irradiated portions of the resin film. The unirradiated portions of the resin film were removed by washing with hot water. Heating was conducted at 180° C. for 20 minutes to completely cure the remaining resin film portions. The thickness of the resulting film was 9 μm.

Then, etching was applied to both sides of the iron plate having the above pattern formed thereon, using an aqueous ferric chloride solution (concentration: 43%) of 50° C., to form dented portions of about 50 μm in depth at the exposed portions of the iron plate.

On one side of the resulting iron plate was coated the above resist material using a roll coater to fill the inside of each dented portion and form a film of 30 μm in average thickness. The film (resist material film) was irradiated with ultraviolet rays emitted from a high-pressure mercury lamp, at an intensity of 120 W/cm to cure the resist material film.

The thus obtained iron plate protected at one side with the cured film of the present composition was again subjected to etching using the above aqueous ferric chloride solution to form slit-shaped small perforations at the dented portions.

Thereafter, all the resist films were removed with an aqueous sodium hydroxide solution (concentration: 15%) of 80° C. to obtain a shadow mask.

The properties of the curable composition used in the above production of a shadow mask were evaluated in accordance with the following methods.

(1) Viscosity

The viscosity of the composition at 25° C. was measured using an E type viscometer.

(2) Etching resistance

The condition of the cured film of the composition after secondary etching was evaluated visuallly. The results are shown as follows.

: No change

Δ: Coloring was seen.

X: Swelling, peeling, or the like was seen.

(3) Solubility in alkali and removability

The solubility of the cured resist film in the final step for removal of said film was evaluated visually. The results are shwon as folows.

⊙: The cured film was completely dissolved and removed.

: The cured film was not completely dissolved but was removed.

X: The cured film could not be removed.

(4) Pattern normality

A light was applied to the back side of the shadow mask obtained, to examine the uniformity of the brightnesses of the lights which came out from the slit-shaped rectangular holes formed in the shadow mask and thereby examine the normality of hole shape and hole-to-hole distance.

⊙: Normal in all respects.

: When ten shadow mask products were examined, about one flaw was found in one shadow mask product, on average.

Δ: When ten shadow mask products were examined, about one to two flaws were found in each of three shadow mask products, on an average.

X: There were a number of flaws.

The results are shown in Table 1.

EXAMPLES 2–5

Active energy ray-curable compositions were obtained in the same manner as in Example 1 except that the component (d) was changed as shown in Tables 1 and 2. Using the compositions, shadow masks were produced in the same manner as in Example 1. Results of the property evaluations are shown in Tables 1 and 2.

COMPARATIVE EXAMPLE 1

A shadow mask was produced by using a composition excluding the component (d) from the composition of Example 1. Results of the property evaluations are shown in Table 2.

TABLE 1

|  |  | Example 1 | Example 2 | Example 3 |
|---|---|---|---|---|
| Component (d) | Dodecylmercaptan | 0.5 | 0.02 | 0 |
|  | Nonylmercaptan | 0 | 0 | 0.3 |
|  | Octylmercaptan | 0 | 0 | 0 |
|  | Thiolactic acid | 0 | 0 | 0 |
| Properties | Viscosity at 25° C. (cp) | 1600 | 1620 | 1620 |
|  | Etching resistance |  |  |  |
|  | Solubility in alkali and removability | ○ |  | ○ |
|  | Pattern normality | ○ |  | ○ |

TABLE 2

|  |  | Example 4 | Example 5 | Comparative Example 1 |
|---|---|---|---|---|
| Component (d) | Dodecylmercaptan | 0 | 0 | 0 |
|  | Nonylmercaptan | 0 | 0 | 0 |
|  | Octylmercaptan | 2.8 | 0 | 0 |
|  | Thiolactic acid | 0 | 5.0 | 0 |
| Properties | Viscosity at 25° C. (cp) | 1590 | 1660 | 1610 |
|  | Etching resistance |  |  |  |
|  | Solubility in alkali and removability | ○ | ○ |  |

TABLE 2-continued

|  | Example 4 | Example 5 | Comparative Example 1 |
|---|---|---|---|
| Pattern normality | ○ |  | x |

EXAMPLES 6-9

Active energy ray-curable compositions were obtained in the same manner as in Example 1 except that the component (a) and the component (b) were changed as shown in Table 3.

The subsequent procedure was conducted in the same manner as above, and the cured resist films obtained were evaluated for properties. The results are shown in Table 3. In all of Examples 6-9, etching resistance was

TABLE 3

|  |  | Example 6 | Example 7 | Example 8 | Example 9 |
|---|---|---|---|---|---|
| Component (a) | ARONIX M-5300 (polycaprolactone acrylate) | 15 | 15 | 0 | 35 |
|  | ARONIX M-5400 (acryloyloxyethyl monophthalate) | 5 | 0 | 30 | 0 |
|  | ARONIX M-5500 (acryloyloxyethyl monosuccinate) | 0 | 15 | 0 | 35 |
|  | ARONIX M-5600 (acrylic acid dimer) | 0 | 0 | 30 | 0 |
| Component (b) | ARONIX M-210 (diacrylate of bisphenol A-ethylene oxide adduct) | 40 | 0 | 20 | 15 |
|  | ARONIX M-215 (tris(2-hydroxyethyl)isocyanurate diacrylate) | 0 | 35 | 0 | 15 |
|  | ARONIX M-305 (pentaerythritol triacrylate) | 40 | 35 | 0 | 0 |
|  | ARONIX M-309 (trimethylolpropane triacrylate) | 0 | 0 | 20 | 0 |
| Properties | Viscosity at 25° C. (cp) | 730 | 1120 | 740 | 420 |
|  | Solubility in alkali and removability | ○ | ◉ | ◉ | ◉ |
|  | Pattern normality | ○ | ◉ | ◉ | ◉ |

EXAMPLE 10

The following six components were dissolved and mixed to obtain an active energy ray-curable composition.

| Component (a): acryloyloxyethyl monophthalate [ARONIX M-5400 (trade name) manufactured by TOAGOSEI CHEMICAL INDUSTRY, CO., LTD.] | 50 parts |
|---|---|
| Component (b): diacrylate of ethylene oxide adduct of bisphenol A [ARONIX M-210 (trade name) manufactured by TOAGOSEI CHEMICAL INDUSTRY CO., LTD.] | 50 parts |
| Component (c): Megafac F-177 manufactured by DAINIPPON INK & CHEMICALS, INC. | 0.01 part |
| Component (d): mercaptopropionic acid | 1 part |
| Photoinitiator: benzyldimethylketal [Irgacure 651 | 5 parts |

-continued

| | |
|---|---|
| (trade name) manufactured by Chiba-Geigy (Japan) Limited] | |
| Diluent: hydroxyethyl acrylate | 10 parts |

EXAMPLES 11-13

Active energy ray-curable compositions were obtained in the same manner as in Example 10 except that the component (c) and the diluent were changed as shown in Table 4.

The above compositions obtained in Examples 10-13 were subjected to the same procedure as above to obtain the respective cured films. The films were evaluated for properties. The results are shown in Table 4.

TABLE 4

| | | Example 10 | Example 11 | Example 12 | Example 13 |
|---|---|---|---|---|---|
| Component (c) | Megafac F-179 | 0.01 | 0 | 0.1 | 0 |
| | Fluorad FC-430 | 0 | 0.06 | 0 | 0.9 |
| | NUC Silicone L7002 | 0 | 0 | 0.1 | 0 |
| Diluent | Hydroxyethyl acrylate | 10 | 0 | 0 | 0 |
| | Butanol | 0 | 20 | 0 | 0 |
| | Acryloylmorpholine | 0 | 0 | 10 | 0 |
| Properties | Viscosity at 25° C. (cp) | 1900 | 1950 | 2300 | 4800 |
| | Etching resistance | ○ | ⊙ | ⊙ | ○ |
| | Solubility in alkali and removability | ⊙ | ⊙ | ⊙ | ⊙ |
| | Pattern normality | ○ | ⊙ | ⊙ | ⊙ |

EXAMPLE 14

The following four components were dissolved and mixed to obtain an ultraviolet ray-curable composition.

| | |
|---|---|
| Component (a): acryloyloxyethyl monophthalate [ARONIX M-5400 (trade name) manufactured by TOAGOSEI CHEMICAL INDUSTRY, CO., LTD.] | 60 parts |
| Component (b): trimethylolpropane triacrylate [ARONIX M-309 (trade name) manufactured by TOAGOSEI CHEMICAL INDUSTRY, CO., LTD.] | 40 parts |
| Component (c): Megafac F-177 manufactured by DAINIPPON INK & CHEMICALS, INC. | 0.1 part |
| Component (e): 2-methyl-[4-(methylthio)phenyl]-2-morpho-lino-1-propanone [Irgacure 907 (trade name) manufactured by Chiba-Geigy (Japan) Limited] | 5 parts |

EXAMPLES 15-17

Ultraviolet ray-curable compositions were obtained in the same constitution as in Example 14 except that the component (e) was changed to compounds shown in Table 5.

Using these compositions, the respective shadow masks were produced. The results are shown in Table 5.

In Example 16, two parts of Irgacure 651 (trade name of benzyldimethylketal) manufactured by Chiba-Geigy (Japan) Limited was used as a photoinitiator, in addition to the component (e).

TABLE 5

| | | Example 14 | Example 15 | Example 16 | Example 17 |
|---|---|---|---|---|---|
| Component (e) | Irgacure 907 | 5 | 0 | 0 | 3 |
| | Irgacure 369 | 0 | 5 | 0 | 0 |
| | Methyl P-dimethyl-aminobenzoate | 0 | 0 | 3 | 2 |
| Other photoinitiator | Irgacure 651 | 0 | 0 | 2 | 0 |
| Properties | Viscosity at 25° C. (cp) | 2500 | 2500 | 2500 | 2500 |
| | Etching resistance | | | | |
| | Solubility in alkali and removability | ○ | ○ | ⊙ | ⊙ |
| | Pattern normality | ⊙ | ⊙ | ⊙ | ⊙ |

COMPARATIVE EXAMPLES 2-4

In the curable composition of Example 14, no photoinitiator belonging to the component (e) was used, and instead the following other photoinitiators were used.

| | |
|---|---|
| Comparative Example 2: Irgacure 184 (trade name of 1-hydroxy cyclohexyl phenyl ketone) manufactured by Chiba-Geigy (Japan) Limited | 5 parts |
| Comparative Example 3: Irgacure 651 | 5 parts |
| Comparative Example 4: Irgacure 184 | 2 parts and |
| Irgacure 651 | 3 parts |

In all of the cases using the above compositions, evaluations for pattern normality were X.

We claim:

1. A process for producing a shadow mask, comprising the following steps (1) to (4), wherein a curable composition, comprising a compound having one carboxyl group and one (meth)acryloyl group in the molecule, a compound having two or more (meth)acryloyl groups in the molecule, a leveling agent, and a chain transfer agent, is used as a secondary etching resist material in the step (2):

(1) a primary etching step of applying etching to at least one side of a metal sheet for a shadow mask, which sheet consists of a thin metal plate and etching resist films formed on both sides of the plate in a desired pattern, to form dented portions at the exposed places provided in the side of the metal sheet, (2) a step of coating a secondary etching resist material on the side or one of the two sides of the metal sheet having the dented portions formed in the primary etching step (1), (3) a secondary etching step of applying etching to the side of the metal sheet on which no secondary etching resist material was coated in the step (2), to form small perforations communicating with the dented portions of the other metal sheet side formed in the step (1), and (4) a step of removing all of the etching resist films and material by using an aqueous alkali solution.

2. A process for producing a shadow mask, comprising the following steps (1) to (4), wherein an ultraviolet ray-curable composition, comprising a compound having one carboxyl group and one (meth) acryloyl group in the molecule, a compound having two or more (meth)acryloyl groups in the molecule, a leveling agent, and a tertiary amine type photoinitiator, is used as a secondary etching resist material in the step (2):

(1) a primary etching step of applying etching to at least one side of a metal sheet for a shadow mask, which sheet consists of a thin metal plate and etching resist films formed on both sides of the plate in a desired pattern, to form dented portions at the exposed places provided in the side of the metal sheet, (2) a step of coating a secondary etching resist material on the side or one of the two sides of the metal sheet having the dented portions formed in the primary etching step (1), (3) a secondary etching step of applying etching to the side of the metal sheet on which no secondary etching resist material was coated in the step (2), to form small perforations communicating with the dented portions of the other metal sheet side formed in the step ( 1 ), and (4) a step of removing all of the etching resist films and material by using an aqueous alkali solution.

* * * * *